United States Patent
Kandori et al.

(10) Patent No.: US 8,928,042 B2
(45) Date of Patent: Jan. 6, 2015

(54) STRUCTURE HAVING PLURAL CONDUCTIVE REGIONS AND PROCESS FOR PRODUCTION THEREOF

(75) Inventors: Atsushi Kandori, Ebina (JP); Chienliu Chang, Kawasaki (JP); Makoto Takagi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 662 days.

(21) Appl. No.: 12/935,270

(22) PCT Filed: May 29, 2009

(86) PCT No.: PCT/JP2009/060298
§ 371 (c)(1),
(2), (4) Date: Sep. 28, 2010

(87) PCT Pub. No.: WO2009/148144
PCT Pub. Date: Dec. 10, 2009

(65) Prior Publication Data
US 2011/0031568 A1  Feb. 10, 2011

(30) Foreign Application Priority Data
Jun. 2, 2008 (JP) .................................. 2008-144166

(51) Int. Cl.
*H01L 29/84* (2006.01)
*B81B 3/00* (2006.01)

(52) U.S. Cl.
CPC .......... *B81B 3/0086* (2013.01); *B81B 2207/07* (2013.01)
USPC ............. 257/254; 257/415; 257/417; 438/50; 438/53

(58) Field of Classification Search
USPC ......................................................... 257/254
See application file for complete search history.

(56) References Cited

U.S. PATENT DOCUMENTS

| 5,998,924 | A | 12/1999 | Yamamoto et al. |
| 7,149,442 | B2 | 12/2006 | Ushijima et al. |
| 7,262,071 | B2 | 8/2007 | Larmer et al. |
| 7,382,137 | B2 | 6/2008 | Ushijima et al. |
| 7,678,600 | B2 * | 3/2010 | Villa et al. ..................... 438/48 |

(Continued)

FOREIGN PATENT DOCUMENTS

| JP | 2003-526207 A | 9/2003 |
| WO | 2006/123298 | 11/2006 |

(Continued)

OTHER PUBLICATIONS

U.S. Appl. No. 12/595,035, filed Oct. 7, 2009, Applicants: C. Chang and K. Nagae.

(Continued)

*Primary Examiner* — Matthew W Such
*Assistant Examiner* — Scott Stowe
(74) *Attorney, Agent, or Firm* — Fitzpatrick, Cella, Harper & Scinto

(57) ABSTRACT

A structure having a plurality of conductive regions insulated electrically from each other comprises a movable piece supported movably above the upper face of the conductive region, the movable piece having an electrode in opposition to the conductive region, the structure being constructed to be capable of emitting and receiving electric signals through the lower face of the conductive region, the plural conductive regions being insulated by sequentially connected oxidized regions formed from an oxide of a material having through-holes or grooves.

12 Claims, 19 Drawing Sheets

(56) References Cited

U.S. PATENT DOCUMENTS

| | | |
|---|---|---|
| 7,741,851 B2 | 6/2010 | Ushijima et al. |
| 2001/0013630 A1 | 8/2001 | Cho et al. .................. 438/411 |
| 2006/0121735 A1 | 6/2006 | Aikele et al. .................. 216/2 |
| 2008/0264167 A1 | 10/2008 | Kandori et al. |
| 2008/0290490 A1 | 11/2008 | Fujii et al. |
| 2008/0290756 A1* | 11/2008 | Huang .................. 310/300 |
| 2009/0193893 A1 | 8/2009 | Kandori et al. |
| 2009/0205423 A1 | 8/2009 | Takagi et al. |
| 2010/0213791 A1 | 8/2010 | Kandori et al. |

FOREIGN PATENT DOCUMENTS

| | | |
|---|---|---|
| WO | 2006123299 A | 11/2006 |
| WO | WO 2006123298 A2 * | 11/2006 |
| WO | 2006134580 A | 12/2006 |
| WO | 2009/005160 | 1/2009 |

OTHER PUBLICATIONS

Cheng, et al., "Electrical through-wafer interconnects with sub-pico-farad parasitic capacitance [MEMS packaging]", Micro-electromechanical Systems Conference, pp. 18-21, 2001.

Zhuang, et al., "Integration of trench-isolated through-wafer interconnects with 2D capacitive micromachined ultrasonic transducer arrays," Sensors and Actuators A 138 (2007) 221-229.

Chinese Office Action dated Oct. 9, 2012 from related Chinese Patent Appln No. 2009-80119872.7 (with English Translation).

Chinese Office Action dated Dec. 21, 2011 in corresponding Chinese Application No. 200980119872.7. (with English Translation).

International Preliminary Report on Patentability dated Dec. 6, 2010, issued in corresponding PCT Application No. PCT/JP2009/060298.

* cited by examiner

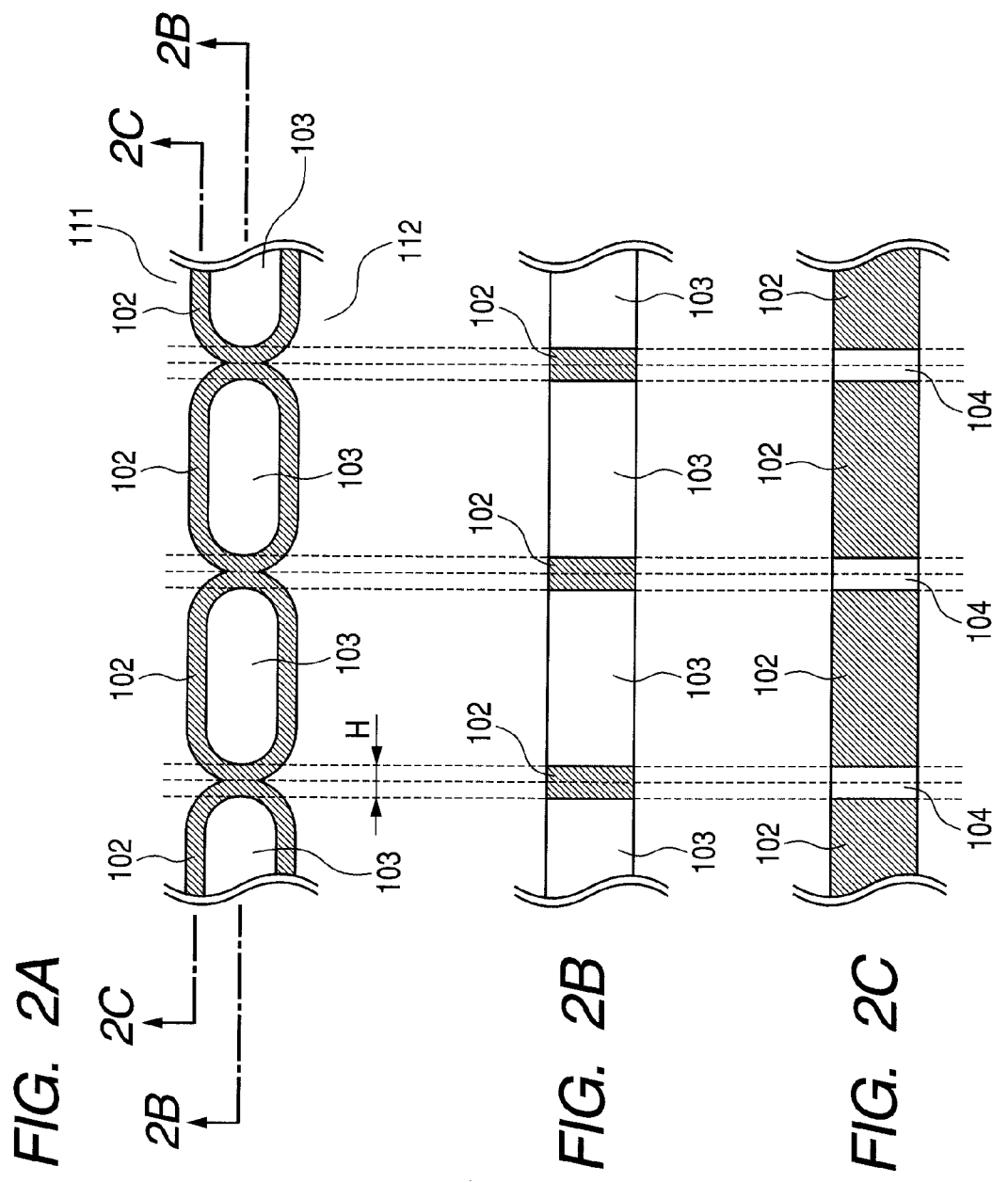

STRUCTURE HAVING PLURAL CONDUCTIVE REGIONS AND PROCESS FOR PRODUCTION THEREOF

TECHNICAL FIELD

The present invention relates to a microstructure or a like structure having a plurality of conductive regions isolated electrically, and to a process for producing the structure.

BACKGROUND ART

Actuators are disclosed which vibrate a thin membrane by an electrostatic force. Sensors are disclosed which detect displacement of a membrane caused by an external force from a change of the electrostatic capacitance. Such a thin membrane is produced by a technique called MEMS (micro electro-mechanical system) employing a semiconductor working technique.

One application of the actuator or the sensor is an ultrasonic transducer, which has both a function of an actuator emitting an ultrasonic wave by vibrating a membrane and a function of a sensor receiving an ultrasonic wave reflected by an object matter by displacement of the membrane in integration. The ultrasonic transducer is constituted of an array of such elements for emitting and receiving signals.

For connecting the electrodes in the arrayed elements with the respective circuits for driving and detection, wiring is formed through the substrate. For example, in one technique, for decreasing the capacitance between the electrode in the elements and the substrate, a reverse bias is applied to a PN junction formed in a lower portion of the electrode (C. H. Cheng, A. S. Ergun, and B. T. Khuri-Yakub, "Electrical through-wafer interconnects with sub-picofarad parasitic capacitance [MEMS packaging]" in Micro-electromechanical Systems Conference, pp. 18-21, 2001). Further, for decreasing the capacitance between the through-wiring and the substrate, a MIS configuration is formed in the wiring portion (see FIGS. 3AA to 3AB of the above-cited reference). Incidentally the capacitance formed between the electrode in the element and the substrate and the capacitance formed between the through-wiring and the substrate are hereinafter referred to as a parasitic capacitance.

In another technique, the parasitic capacitance is decreased by separating spatially the substrate for forming the membrane for the respective elements to utilize the substrate itself as the electrode as well as the through-wiring (X. Zhuang, A. S. Ergun, Y. Huang, I. O. Wygant, O. Oralkan, and B. T. Khuri-Yakub, "Integration of trench-isolated through-wafer interconnects with 2D capacitive micromachined ultrasonic transducer arrays," Sensors and Actuators A: Physical, vol. 138, pp. 221-229, Jul. 20, 2007, see FIG. 1.)

DISCLOSURE OF THE INVENTION

The parasitic capacitance can increase the power consumption at the actuator driving, or can lower the detection performance of the sensor. To offset such a disadvantage, in a technique, the parasitic capacitance is decreased by applying a reverse bias to the PN junction (Micro electromechanical Systems Conference, pp. 18-21, 2001, 2001). However, this technique requires application of a relatively high voltage, which needs a high resistance substrate, limiting the specification of the substrate. On the other hand, in the technique of the above-cited reference "Sensors and Actuators A: Physical, vol. 138, pp. 221-229, Jul. 20, 2007", the substrate is divided by gaps into elements, which decreases the mechanical strength of the substrate.

The present invention is directed to a structure having a plurality of conductive regions insulated electrically from each other, comprising a movable piece supported movably above the upper face of the conductive region, the movable piece having an electrode in opposition to the conductive region, the structure being constructed to be capable of emitting and receiving electric signals through the lower face of the conductive region, the plural conductive regions being insulated by sequentially connected oxidized regions formed from an oxide of a material having through-holes or grooves.

The pairs of the conductive region and the movable piece can be provided in plurality.

The present invention is directed to an ultrasonic transducer comprising the structure, wherein the movable piece is a membrane, and a closed gap is formed between the conductive region and the membrane.

The present invention is directed to a physical sensor comprising the structure, being capable of taking out, from the lower face of the conductive region, an electric signal of a change in the electrostatic capacitance between the conductive region and the electrode.

The present invention is directed to a process for producing a structure in a shape of a substrate having conductive regions, functioning as electric wirings in a thickness direction and being insulated electrically from each other, comprising steps of:

forming through-holes or grooves at intervals through or on a base material of the substrate, and oxidizing thermally the base material at least at an inside face of the through-holes or grooves to form a sequentially connected oxidized regions to form plural conductive regions insulated electrically from each other.

The process comprising further a step of providing a movable piece supported movably on the upper side of at least one of the conductive regions.

The structure of the present invention has a substrate having electrical wirings in the thickness direction, having conductive regions insulated electrically from each other. The process for producing the structure comprises a first step of forming plural through-holes or grooves at intervals through or on the base material of the substrate, and a second step of thermally oxidizing the base material at least at the inside face of the through-holes or the grooves to form a sequentially connected oxidized region containing the through-holes or grooves to form electrically insulated conductive regions in the base material.

Effects of the Invention

According to the present invention, signals can be emitted or received through the lower faces of the conductive regions, the conductive regions being insulated by the above-mentioned oxidized region. Therefore, a voltage for the insulation need not be applied, and a drop of the mechanical strength is prevented, whereby a micro structure or a like structure can be produced which has a decreased parasitic capacitance.

Further features of the present invention will become apparent from the following description of exemplary embodiments with reference to the attached drawings.

BRIEF DESCRIPTION OF THE DRAWINGS

FIGS. 2A, 2B and 2C are drawings for describing the insulation portion between the oxidized regions in the first embodiment.

BEST MODE FOR CARRYING OUT THE INVENTION

The basic embodiment of the present invention is a structure which has a plurality of conductive regions or through-electrodes insulated electrically. The structure has a movable piece such as a movably supported membrane and a swing member above the upper face of the conductive region. The movable piece has an electrode facing the conductive region. The structure is constructed to be capable of emitting and receiving electric signals through the lower face of the conductive region reverse to the upper layer containing the movable piece. The plural conductive regions are insulated from each other by sequentially connected oxidized regions composed of an oxide of a material constituting the through-holes or grooves. An array type structure containing plural elements insulated electrically can be readily formed by employing a plurality of pairs of the conductive region and the movable piece. An array type ultrasonic transducer can be constructed by employing a membrane as the movable piece and forming a closed gap between the conductive region and the membrane. A physical quantity sensor such as an acceleration sensor can be constructed for taking out an electric signal indicating a change in the electrostatic capacitance between the conductive region and the electrode from the lower face of the conductive region.

The aforementioned structure which has an electric wiring in the thickness direction through a substrate and has plural conductive regions insulated electrically can be produced through the process shown below. The production process comprises a first step of forming plural through-holes or grooves at intervals through or on the base material of the substrate, and a second step of thermally oxidizing the base material at least at the inside faces of the through-holes or the grooves to form a sequentially connected oxidized regions to form electrically insulated conductive regions in the base material. The process may further comprise a step of providing a movable piece on the upper face side of at least one of the conductive regions.

The embodiments of the present invention are described below in detail with reference to drawings.

First Embodiment

Figure 1:
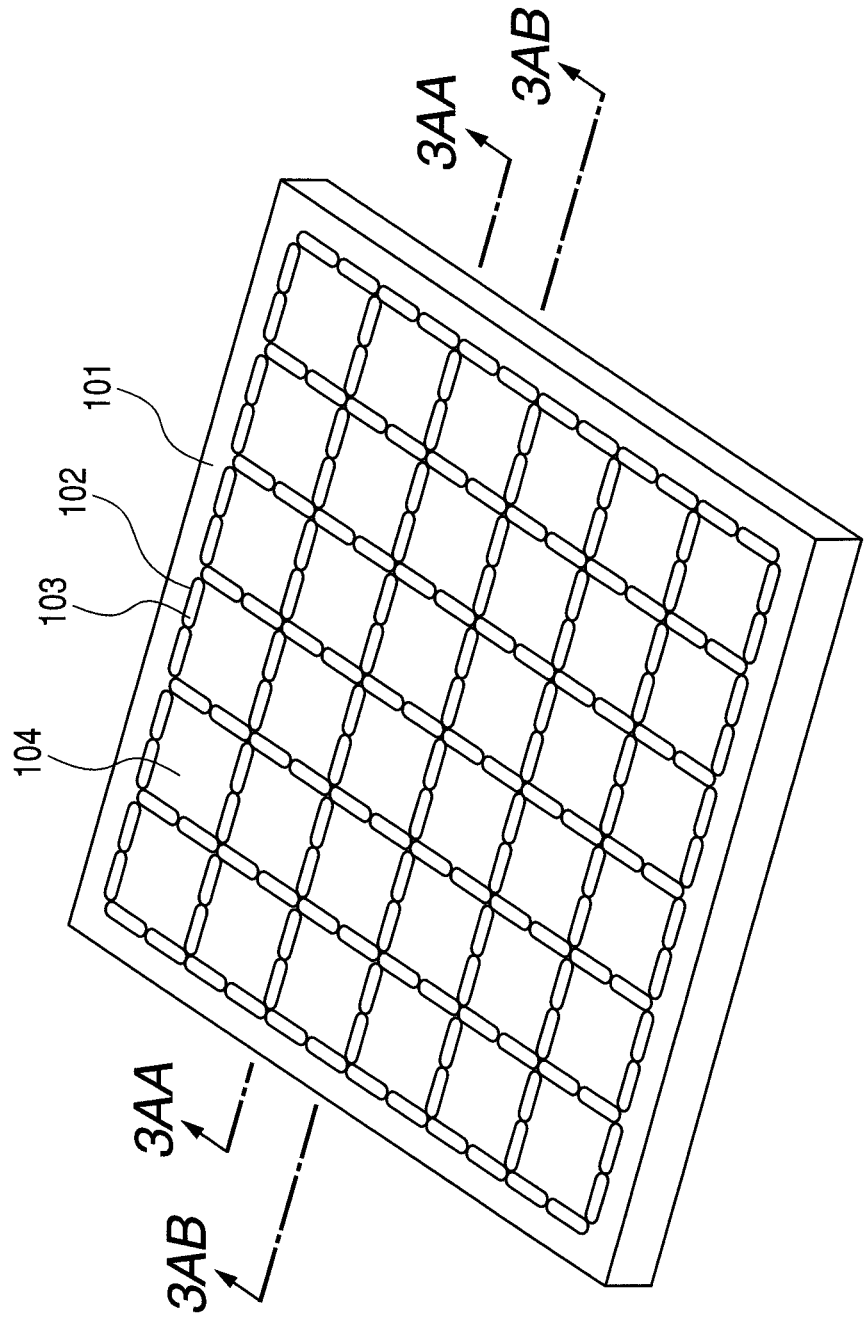
FIG. 1 is a perspective view of a structure, having a through-wiring, of a first embodiment of the present invention.

A first embodiment is described with reference to FIG. 1. FIG. 1 is a perspective view of conductive regions, namely through-wirings, of a structure of a first embodiment of the present invention. In FIG. 1, the numerals denote the followings: 101, a substrate; 102, an insulation film (oxide); 103, a through-hole; 104, a through-wiring (conductive region).

Through-wirings 104 in substrate 101 are insulated from each other electrically by insulating film 102 having through-holes 103. Substrate 101 has a low electric resistance, and plural insulated regions of the substrate serve as through-wirings 104 in the thickness direction.

FIGS. 2A, 2B, and 2C are enlarged views of a part of thermally oxidized film 102 (sequentially connected oxidized regions having through-holes or grooves). FIG. 2A is a plan view, FIG. 2B is a sectional view of the substrate taken along line 2B-2B, and FIG. 2C is a sectional view of the substrate taken along line 2C-2C. In FIGS. 2A, 2B, and 2C, the reference numeral 111 denotes a first region, and the reference numeral 112 denotes a second region. First region 111 and second region 112 function variously depending on the position in thermally oxidized film 102. In the drawing, the symbol H denotes a thickness of thermally oxidized film 102 between adjacent through-holes 103.

In the constitution illustrated in FIGS. 2A to 2C, thermally oxidized film 102 is formed to be continuous to partition first region 111 and second region 112, thereby insulating electrically first region 111 from second region 112. Thermally oxidized film 102 has plural through-holes 103, which enables minimization of the volume or thickness of the insulating material (thermally oxidized film) between first region 111 and second region 112 with the necessary mechanical strength retained. Thereby the structure is less liable to cause deformation of the movable piece or the substrate by stress of the thermally oxidized film.

Figure 3A:
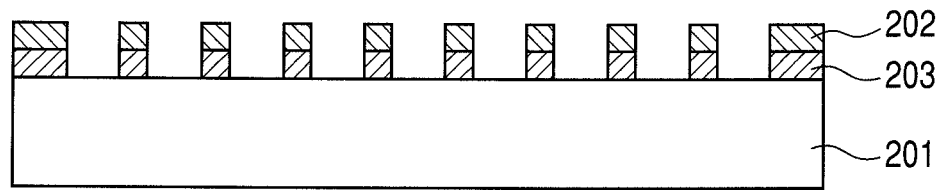
FIGS. 3AA and 3AB are sectional views for describing a process for producing a through-wiring in the first embodiment.
Figure 3A:
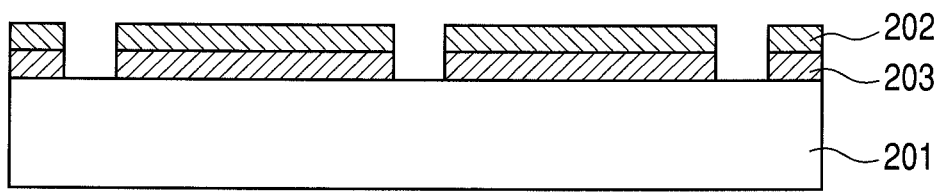

Next, the process for producing the through-wiring of this embodiment is described below. This process comprises a first step of forming through-holes or grooves at intervals through the base material of the substrate, and a second step of thermally oxidizing at least the base material at the inside face of the through-holes or the grooves to form a sequentially connected oxidized regions to form electrically insulated conductive regions in the base material. FIGS. 3AA to 3EB are sectional views for describing the process for producing the structure of this embodiment. FIGS. 3AA, 3BA, 3CA, 3DA, and 3EA are sectional views taken along broken line 3AA-3AA in FIG. 1, and FIGS. 3AB, 3BB, 3CB, 3DB, and 3EB are sectional views taken along broken line 3AB-3AB.

For ease of viewing, in FIGS. 3AA, 3BA, 3CA, 3DA, and 3EA, a less number of through-holes are illustrated, and in FIGS. 3AB, 3BB, 3CB, 3DB, and 3EB, a less number of conductive regions are illustrated. In FIG. 3AA to 3EB, the reference numerals denote the followings: 201, a silicon substrate as the base material through which the through-wirings are formed; 202, a resist; 203, a masking material, 204, a thermally oxidized film (oxidized region); 210 a through-hole in the oxidized region.

Firstly, as illustrated in FIGS. 3AA and 3AB, a film of masking material 203 is formed on one face of silicon substrate 201, resist 202 is applied thereon, and resist 202 is patterned as desired. Masking material 203 is etched off selectively by utilizing the remaining resist pattern. At the portions where the masking material has been etched off, through-holes 210 are formed in the subsequent dry etching through the silicon. Specifically, portions of through-holes 210 of the oxidized region, and the portions not necessary for the structure (necessary portions including movable pieces, beams, movable electrodes, fixed electrodes, supporting substrate, etc.) are removed simultaneously. The material useful as masking material 203 includes metals such as aluminum; and silicon nitride, silicon oxide, polysilicon, and so forth. However the masking material is not limited thereto, insofar as the material is resistant in the subsequent anisotropic etching step. The pattern of resist 203 may be removed, or may be kept for use as a mask in the subsequent dry etching step. By use of this resist pattern, another masking material need not be used.

Figure 3B:
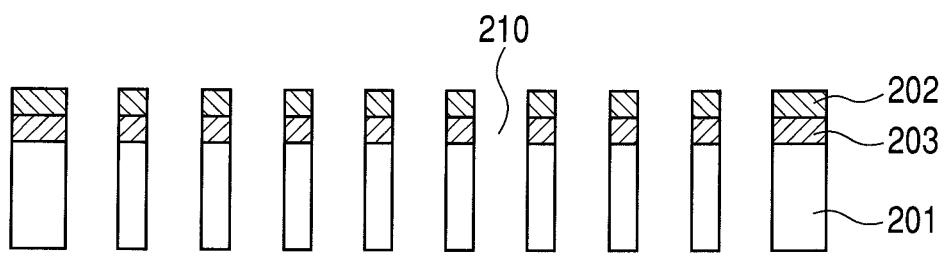
FIGS. 3BA and 3BB are sectional views for describing a process for producing a through-wiring in the first embodiment.
Figure 3B:
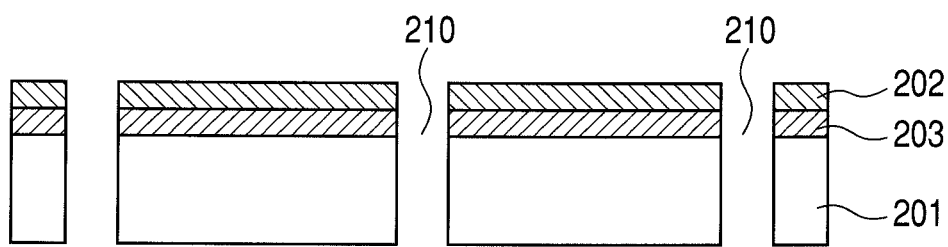

Then, as illustrated in FIGS. 3BA and 3BB, the substrate is anisotropically etched at the unmasked portions to form through-holes 210 to penetrate substrate 201. The anisotropic etching can be conducted by dry etching such as Si-Deep-RIE (silicon deep reactive ion etching).

Figure 3C:
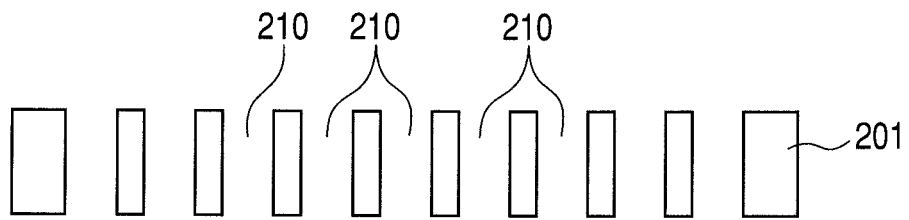
FIGS. 3CA and 3CB are sectional views for describing a process for producing a through-wiring in the first embodiment.
Figure 3C:
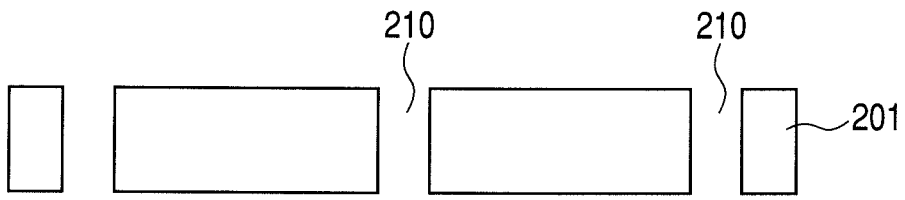

After the anisotropic etching, as illustrated in FIGS. 3CA and 3CB, mask material 203 and resist 202 are removed and the surface of silicon substrate 201 is cleaned.

Figure 3D:
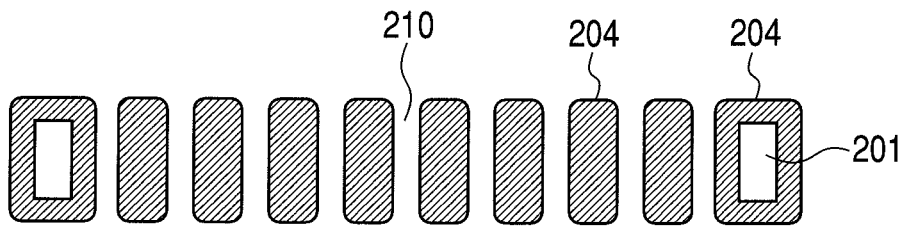
FIGS. 3DA and 3DB are sectional views for describing a process for producing a through-wiring in the first embodiment.
Figure 3D:
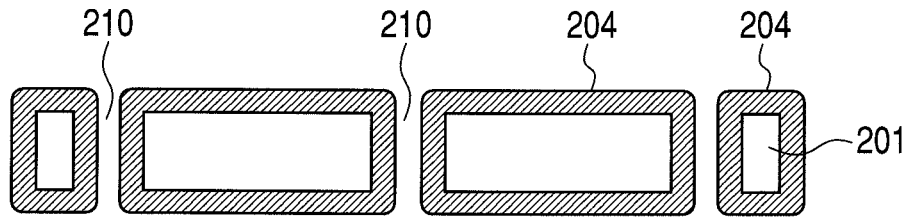

Then the silicon is thermally oxidized from the surface as illustrated in FIGS. 3DA and 3DB. In this thermal oxidation step, silicon 201 is kept in an oxygen atmosphere at a temperature of 1000° C. or higher for a long time. Thereby silicon oxide grows on the bared surface as well as into the silicon to expand the oxidized region 204. (The ratio of the thickness of the former to the latter is about 55:45.)

Figure 4A:
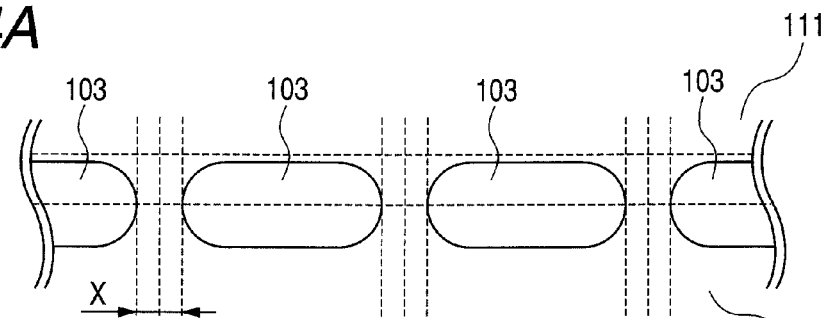
FIGS. 4A, 4B, and 4C are drawings for describing a thermal oxidation step in production of the through-wiring in the first embodiment.
Figure 4B:
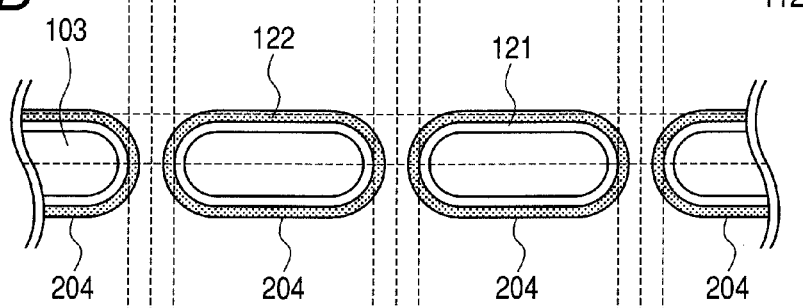
Figure 4C:
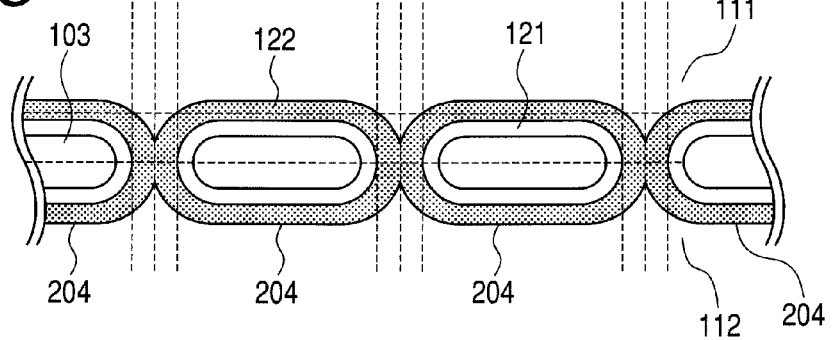

The process of the thermal oxidation is described below. FIGS. 4A, 4B, and 4C are plan views of the substrate showing the progress of the thermal oxidation. In FIGS. 4A to 4C, the reference numerals denote the followings: 111, a first region; 112, a second region; 121, a thermally oxidized film grown on the surface of the silicon; 122, a thermally oxidized film grown into the interior of the silicon. FIG. 4A illustrates the state before the oxidation. In this state, first region 111 and second region 112 are not insulated from each other since the partitions between through-holes 103 are formed by silicon (partition thickness: X).

FIG. 4B illustrates a state of the thermal oxidation for half of an intended oxidation time length. In this state, thermally oxidized film 121 grows on the surface of through-holes 103, and thermally oxidized film 122 grows into the interior of the silicon. Thereby the thickness X of the silicon partitioning adjacent through-holes 103 is decreased to cause slight insulation between first region 111 and second region 112.

FIG. 4C illustrates a state after the thermal oxidation for an intended time. In this state, thermal oxidized films 122 grown from the adjacent through-holes 103 into the silicon come into contact with each other to become integrated. Thereby, first region 111 and second region 112 are insulated from each other.

The thickness of the thermal oxidized film 204 is a logarithmic function of the thermal oxidation time. Therefore the thickness of the thermally oxidized film 204 will become saturated at a certain thickness (1 µm to several 1 µm) with the duration of the oxidation. Therefore, the thickness of the thermal oxidized film can be controlled with a high precision. In consideration of the practical process time, for sure electrical insulation between the conductive regions by complete oxidation of the silicon between through-holes 103, the minimum interval between through-holes 103 (the thickness X in FIG. 4A) is preferably not larger than 2 µm.

On the other hand, for the anisotropic etching of the silicon, the thickness of the substrate (i.e., the depth of the through-holes) is preferably not more than 100 µm.

With the substrate of a thickness of 100 µm or larger, the etching direction can become tilted to cause non-negligible deformation by thermal stress caused by asymmetry between the shapes of the thermally oxidized film and the silicon (non-symmetry to the face at the portion of an intermediate thickness of the substrate).

Through the above steps, electrically insulated plural conductive regions are formed. That is, electrically insulated plural conductive regions can readily be formed by boring through-holes 103 at a small intervals and thermally oxidizing the inside face of the through-holes.

Thermally oxidized film 204 can be formed even in a small gap so long as oxygen is fed thereto. Therefore, the interval between the electrically insulated conductive regions can be made smaller to minimize the influence of the stress in the insulating material (thermally oxidized film) of the oxidized region. Further, in this embodiment, the insulation can be made by complete thermal oxidation of the material intervening between plural through-holes 103. Therefore the through-holes need not be filled with the insulating material, without causing problems by the internal stress thereof.

Further, in this embodiment, the structure can be prepared only with a single silicon substrate, so that a special substrate such as an SOI substrate (silicon-on-insulator substrate) need not be employed.

Figure 3E:
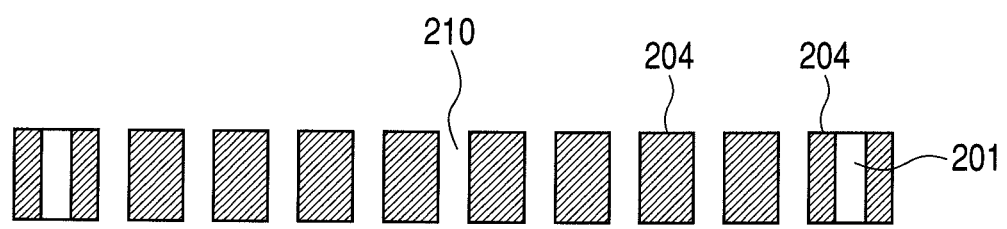
FIGS. 3EA and 3EB are sectional views for describing a process for producing a through-wiring in the first embodiment.
Figure 3E:
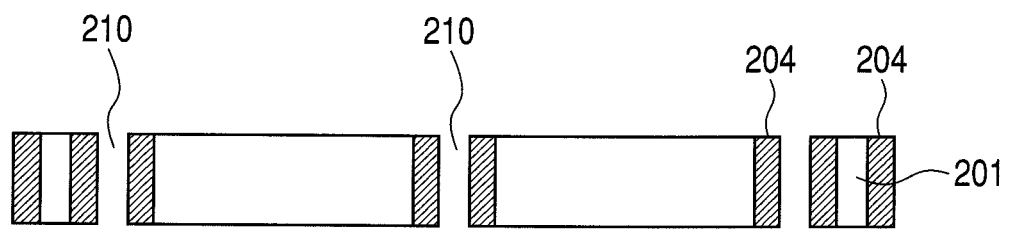

Finally after the step shown in FIGS. 3DA and 3DB, the silicon oxide film on the surface of substrate 201 may be removed by dry etching or a like method from the both faces of the substrate as illustrated in FIGS. 3EA and 3EB. The removal of the thermal oxidized film from the both faces of the substrate enables further decrease of the stress caused by the thermal oxidized film. Incidentally, thermal oxidized film 204 shown in FIG. 3EB is not necessary for the function of the structure, but is formed unavoidably in the production process. This film may be kept unremoved except the portion for electric connection.

In another process, a film of a material like a nitride film resistant to the thermal oxidation may be formed preliminarily on the surface of the substrate and patterned in the same shape as the pattern for dry etching of the through-holes. After the thermal oxidation of this substrate, the preliminarily formed film is removed to remove selectively the formed oxidized film. Thereby the stress formation by the thermal oxidation can be decreased.

When the inside width of through-hole 103 is small, through-holes 103 can be nearly completely filled with thermal oxidized film 121. In the present invention, the sequentially connected oxidized regions include also such types of through-holes and grooves. However, to prevent the adverse effect of the internal stress, the amount of the oxide in oxidized region 204 is preferably less insofar as the oxide performs the insulation function. Usually, the width of the through-hole 103 is made to be several times larger the thickness of the oxidized film.

FIGS. 5A to 5G are drawings for describing the sectional shapes and arrangement of the through-holes in this embodiment. The shape of the through-hole is not limited to that described in the above first embodiment. The through-holes may be in various shapes: circular (FIG. 5A), ellipsoidal, rectangular (FIG. 5B), triangular (FIG. 5C), square, parallelogram (FIG. 5D), polygonal (e.g., octagonal, FIG. 5E), and so forth.

Figure 5A:
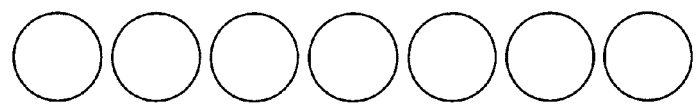
FIGS. 5A, 5B, 5C, 5D, 5E, 5F, and 5G are plan views illustrating examples of the sectional shape and arrangement of the through-holes in the oxidized region.
Figure 5B:
Figure 5C:
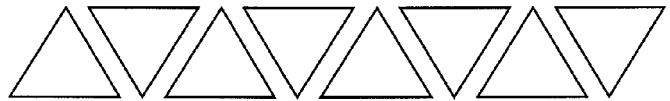
Figure 5D:
Figure 5E:
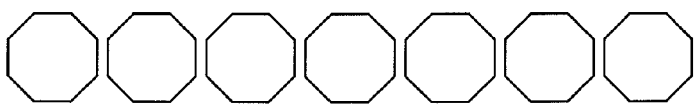
Figure 5F:
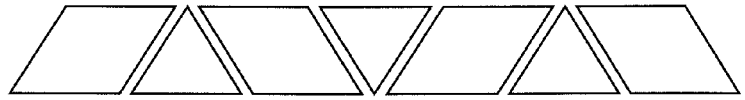
Figure 5G:
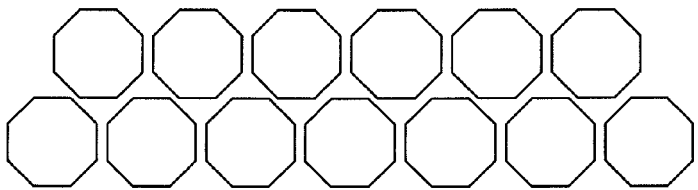

In the example shown in FIG. 5C, the width of the material between the holes is made nearly constant by alternately reversing the direction of the triangles. Otherwise, as shown in FIG. 5F, different shapes of the through-holes may be combined and arranged: in this drawing, triangles and parallelograms are arranged alternately with the direction changed suitably. The arrangement of the through-holes may be linear, curved, stepwise, and so forth. In the example of FIG. 5G, the through-holes are arranged in plural rows and the positions of the hole intervals are displaced in a zigzag manner. Naturally in any of the examples, width of the material of the interval portions between the holes should be designed to be oxidized surely from the inside face of the holes on the both sides to the intermediate position of the material to make the interval insulative.

The shape of the holes is selected suitably to lessen the adverse effect of the stress in the thermally oxidized film to obtain a sufficient mechanical strength of the insulating portion of the structure like a micro-structure.

According to this embodiment, the conductive region is capable of functioning as a through-electrode, and the plural conductive regions are insulated from each other. Thereby electric signals can be taken out from or applied to the lower face of the conductive regions. Therefore a voltage for the insulation need not be applied, the decrease of the mechanical strength is prevented, and the parasitic capacitance can be suppressed, which are different from conventional techniques mentioned in the articles of related background art.

Second Embodiment

Second embodiment is described with reference to FIGS. 6A and 6B. This second embodiment uses the structure of the first embodiment as an array type ultrasonic transducer.

Figure 6A:
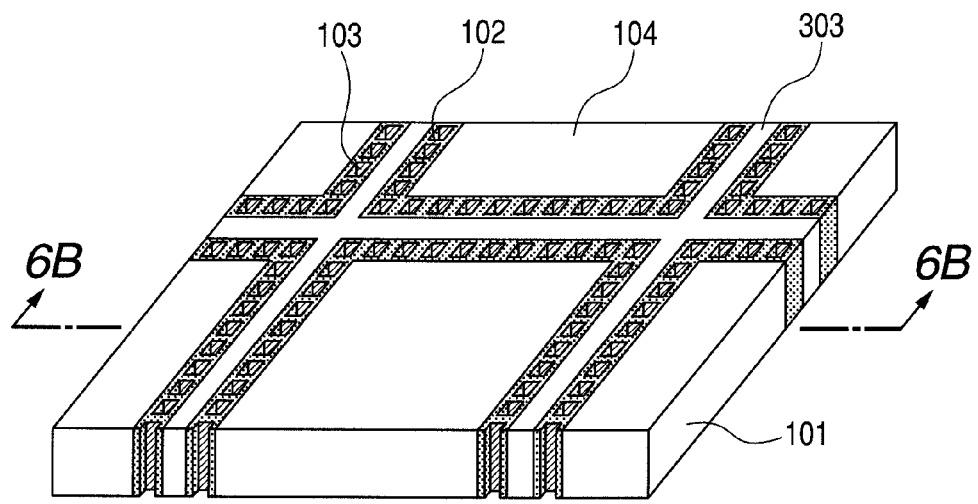
FIGS. 6A and 6B are respectively a perspective view and a sectional view of a structure having a through-wiring of a second embodiment.
Figure 6B:
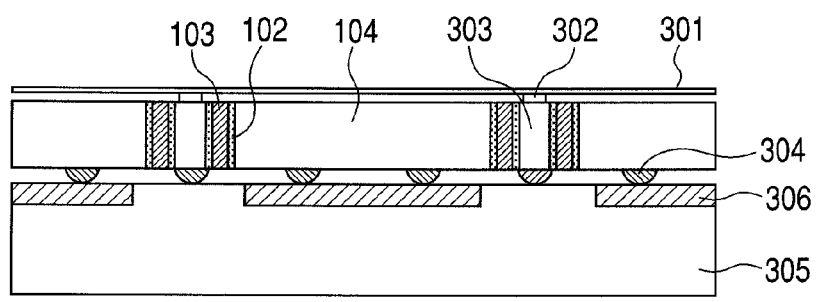

FIGS. 6A and 6B are drawings for describing an array type ultrasonic transducer of this second embodiment. FIG. 6A is a perspective view of a part of the substrate having through-wirings employed for an array type ultrasonic transducer. FIG. 6B is a sectional view, taken along line 6B-6B, of the part of the ultrasonic transducer of this embodiment.

In FIGS. 6A and 6B, the reference numerals denote the followings: 101, a substrate; 102, a thermally oxidized film; 103, a through-hole; 104, a through-wiring (conductive region) which is wholly conductive; 301, a membrane (thin film) serving as a movable piece; 302, a post for supporting movably membrane 301; 303, a frame; 304, a conductive bump; 305, a circuit substrate; 306, an integrated circuit. This constitution itself does not have a closed gap between through-wiring 104 and membrane 301. The closed gap can be formed by sealing the space between substrate 101 and circuit substrate 305 or filling the one side of through-holes 103.

In the drawings after this embodiment, the shape of through-hole 103 or the groove is shown to be tetragonal for simplification of the drawings, but the shape is not limited thereto.

A process for producing an array type ultrasonic transducer of this embodiment is described below. Firstly, according to the process described in the first embodiment, a through-wiring substrate 101 is prepared which has an array of plural through-wirings 104. This through-wiring substrate 101 has a constitution illustrated in FIG. 6A. Through-wirings 104 are respectively surrounded by thermally oxidized film 102 having through-holes 103. Between thermally oxidized films 102, silicon frame 303 is placed. The thermally oxidized film on the front face (reverse face) of through-wiring substrate 101 is removed by etching for use as the wiring (see FIGS. 3EA and 3EB of the first embodiment).

Next, on one face of through-wiring substrate 101, posts 302 are formed along the pattern of frame 303 on the same region. Posts 302 can be formed, for example, by forming a film once and removing the film with specified portions of the film left unremoved.

Then, thin membrane 301 for vibration is bonded on the portions of posts 302. In this embodiment, membrane 301 is made of a conductive material. Thus an ultrasonic wave can be emitted by vibrating membrane 301 by application of a voltage between the lower face of the membrane and the upper face of through-wiring 104. Otherwise an intensity of an ultrasonic wave received by membrane 301 can be measured by detecting change in electrostatic capacitance between the lower face of the membrane and the upper face of the through-wiring 104. The output characteristics of the actuator and the detection characteristics of the sensor of such an array type ultrasonic transducer can be controlled by adjusting the height of post 302 (the height of the above closed gap).

In the last step, bumps 304 are formed on the lower face of through-wiring substrate 101, and circuit substrate 305 and the bumps are bonded. On this circuit substrate 305, integrated circuit 306 is mounted which has a driving circuit for applying a voltage for vibrating membrane 301 and a detection circuit for detecting a change of the electrostatic capacitance of membrane 301. Thereby a driving circuit can be provided for each of the elements to enable emission of an ultrasonic wave (here, one element is constituted of a combination of a through-wiring 104 and membrane 301 formed above the through-wiring). A detection circuit can be placed close to each of the elements, which enables detection of the ultrasonic wave received by the respective element separately with high precision.

In this embodiment, frames 303 contained in through-wiring substrate 101 prevent thermally oxidized film 102 from traversing substrate 101 from side to side, whereby the mechanical strength of through-wire substrate 101 is increased, and a damage in the bump bonding can be prevented.

Post 302 can be formed from a conductive material. Frame 303 can be formed from the same substrate material as that of through-wiring 104. Therefore frame 303 is also constituted of a low-resistance material. In this state, the portion of frame 303, the portion of post 302, and membrane 301 are considered to be at the same potential. Therefore, the potential of membrane 301 can be held at a desired level by bump 304 formed under frame 303.

Post 302 may be formed from an insulating material. When the membrane is made from an insulating material, after the membrane is bonded, a portion of membrane 301 above frame 303 and a portion of post 302 are bored and wiring is made through the bored portion to connect electrically frame 303 with membrane 301 to keep the potential of membrane 301 at a desired level.

In such a manner, according to this embodiment, the potential of frame 303 can be kept at the same level as that of membrane 301. Therefore, the potential of membrane 301 can be controlled at a desired level. Thus, in the array type ultrasonic transducer, an optimum potential can be applied to the membrane for the actuator output characteristics and the sensor detection characteristics. Further, the membrane potential in the actuation and the membrane potential in the sensing can be differentiated to achieve a higher performance.

In this embodiment, membrane 301 is made from a conductive material, but the material is not limited thereto. When membrane 301 is made from an insulating material, an electrode is formed on the membrane from a conductive material for the same use. With such a construction, even when the upper electrode portion and the lower electrode portion come into contact physically together, the electrodes are insulated from each other not to cause damage in integrated circuit 306, preferably.

This conductive electrode on insulating membrane 301 need not be formed on the entire face of the membrane, but may be formed in a desired pattern in a shape suitable for the driving and detection. Thereby in the array type ultrasonic transducer, the actuator output characteristics and the sensor detection characteristics can be improved further.

Otherwise, an insulating film may be placed on the face of through-wiring 104 opposing to membrane 301. Thereby even when conductive membrane 301 comes into contact with the underlying electrode, the electrodes are electrically insulated.

Third Embodiment

Third embodiment is described with reference to FIGS. 7A and 7B. This third embodiment is nearly the same as the second embodiment except that the constitution of through-wiring substrate 101 of the array type ultrasonic transducer is different from that of the second embodiment.

Figure 7A:
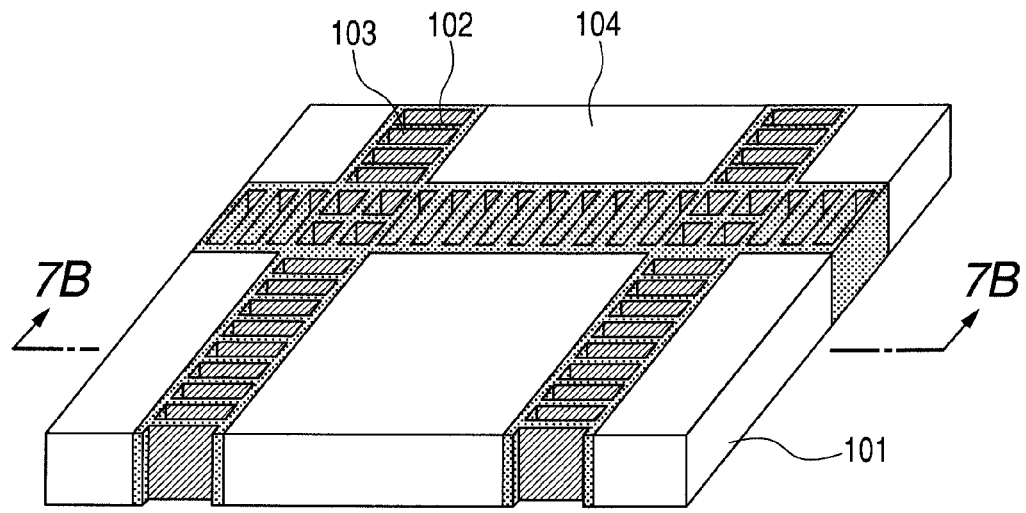
FIGS. 7A and 7B are respectively a perspective view and a sectional view of a structure having a through-wiring of a third embodiment.
Figure 7B:
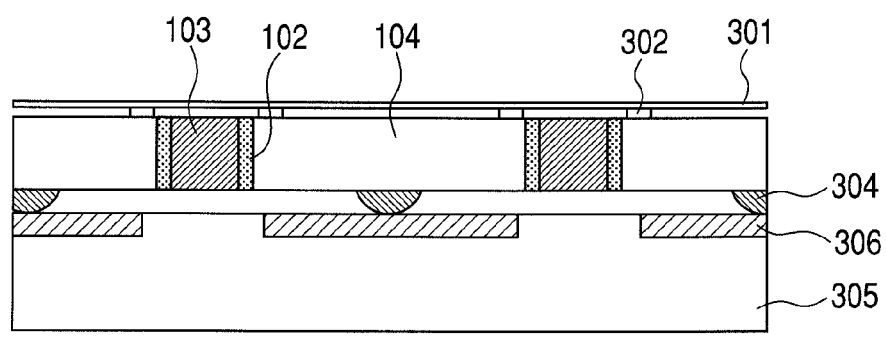

FIGS. 7A and 7B are drawings for describing an array type ultrasonic transducer of this third embodiment. FIG. 7A is a perspective view of the through-wiring substrate employed in an array type ultrasonic transducer. FIG. 7B is a sectional view, taken along line 7B-7B, of a part of the ultrasonic transducer of this embodiment. In FIGS. 7A and 7B, the reference numerals denote the followings: 101, a substrate; 102, a thermally oxidized film; 103, a through-hole; 104, a through-wiring; 301, a membrane, 302, a post; 304, a bump; 305, a circuit substrate; 306, an integrated circuit.

In this embodiment, post 302 is formed in contact with through-wiring 104. Thereby the gap between the upper electrode and the lower electrode can be kept constant precisely, even when post 302 and membrane 301 are formed prior to formation of through-wiring 104.

In more detail, in the constitution of the above second embodiment, in formation of thermally oxidized film 102 having through-holes 103, the gap (space) under membrane 301 communicates with through-holes 103 (see FIGS. 6A and 6B). Therefore, in the case where the membrane is formed firstly with a gap, the silicon of the upper face of through-wiring 104 can be oxidized to make smaller the gap between the upper electrode and the lower electrode. Thereby the range of movement of the membrane decreased to affect adversely the driving characteristics of the transducer. Thus, in the second embodiment, when the membrane is formed with a gap firstly, it is difficult to keep the gap between the upper and lower electrodes without giving an adverse effect on the driving characteristics.

On the other hand, in this embodiment, posts 302 are formed on through-wirings 104 to close the gap under the membrane 301. Therefore, even if membrane 301 is formed with a gap previously, the oxidation will not occur in the gap, so that through-wirings 104 can be insulated electrically from each other without changing the gap between the upper and lower electrodes.

In this embodiment as described above, a substrate may be employed which has a membrane formed preliminarily with a gap by a bonding process or by a surface process by use of a sacrifice layer. Thereby limitation of the production process can be reduced to enable formation of the membrane having more satisfactory characteristics.

Further, in this embodiment, the substrate need not be worked preliminarily for the formation of through-wiring 104, whereby the defective ratio of the products in the process can be lowered. Furthermore frame 303 need not be formed to enable use of the substrate having membrane 301 with a gap. Thereby the distance between through-wirings 104 can be made larger with the size of through-wiring unchanged, whereby the parasitic capacitance between through-wirings 104 can be made smaller to decrease cross talk of driving signals and detection signals.

In this embodiment, thermal oxidation can occur at a portion of membrane 301 placed on trough-holes 103. However, this caused no problem since this portion does not affect the transducer characteristics.

Fourth Embodiment

Fourth embodiment is described with reference to FIGS. 8AA to and 8CB. This fourth embodiment is nearly the same as the second embodiment except the construction of thermally oxidized film 102 of through-wiring substrate 101 of the array type ultrasonic transducer.

Figure 8A:
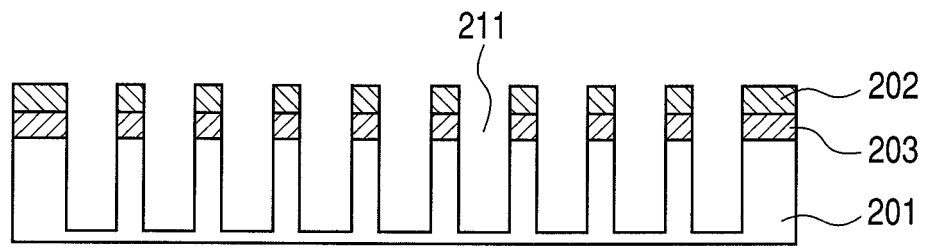
FIGS. 8AA and 8AB are sectional views for describing a process for producing a through-wiring in a fourth embodiment.
Figure 8A:
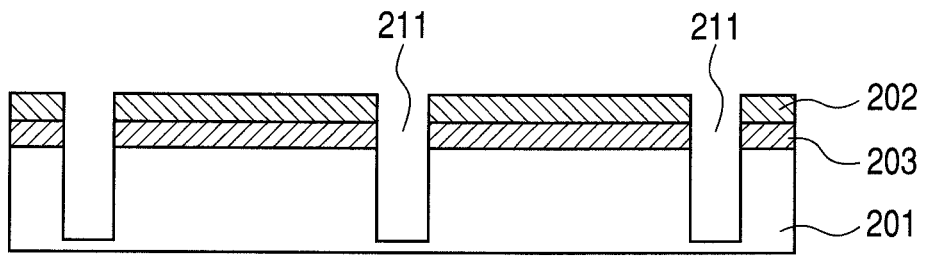

FIGS. 8AA to 8CB are drawings for describing the fourth embodiment of the present invention. FIGS. 8AA and 8AB are sectional views corresponding to FIGS. 3BA and 3BB. In this embodiment, as illustrated in FIGS. 8AA and 8AB, the portions of the holes are grooves 211 which do not penetrate the substrate 211 completely. In this structure, the difference between the thickness of substrate 201 and the depth of groove 211 (i.e., the thickness of the material under the bottom of the groove) should be decided suitably in consideration of the thickness of the thermally oxidized film formed in the silicon by the thermal oxidation. In this embodiment, since the thermal oxidation is conducted from the one side only of substrate 201, the difference should be not more than the thickness of the thermally oxidized film. The difference is preferably not more than 1 μm by the reason mentioned in Embodiment 1. The depth of groove 211 is not more than 100 μm by the reason mentioned in Embodiment 1.

Figure 8B:
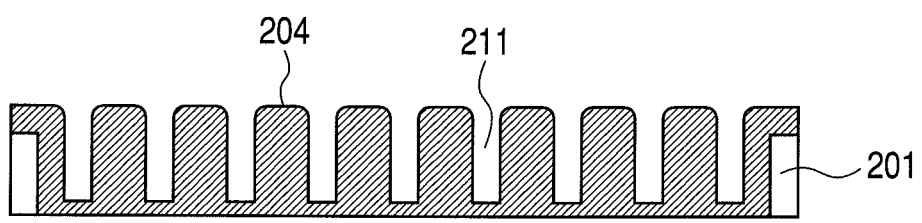
FIGS. 8BA and 8BB are sectional views for describing a process for producing a through-wiring in the fourth embodiment.
Figure 8B:
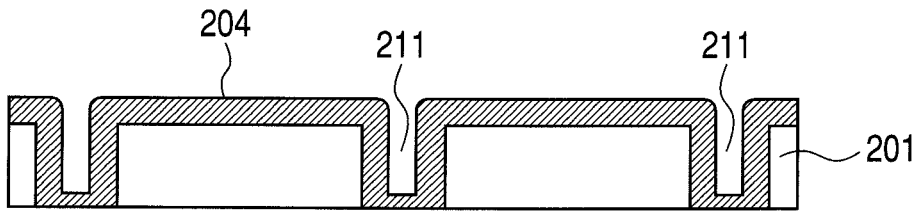

FIGS. 8BA and 8BB are sectional views corresponding to FIGS. 3DA and 3DB of Embodiment 1. The thermal oxidation is conducted from the upper side of the substrate as illustrated in FIGS. 8AA and 8AB to obtain an oxidized article as illustrated in FIGS. 8BA and 8BB. In the thermal oxidation, as illustrated in FIGS. 8BA and 8BB, the lower face of the substrate is protected, so that the thermally oxidized film is not formed on the lower face of the substrate.

Figure 8C:
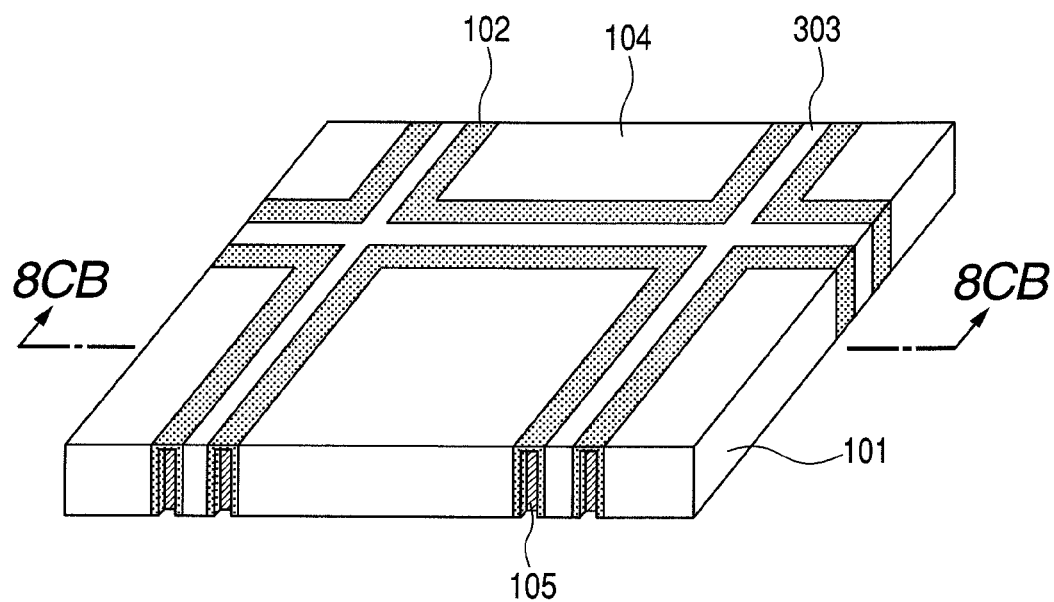
FIGS. 8CA and 8CB are a perspective view and a sectional view of a structure having a through-wiring of the fourth embodiment.
Figure 8C:
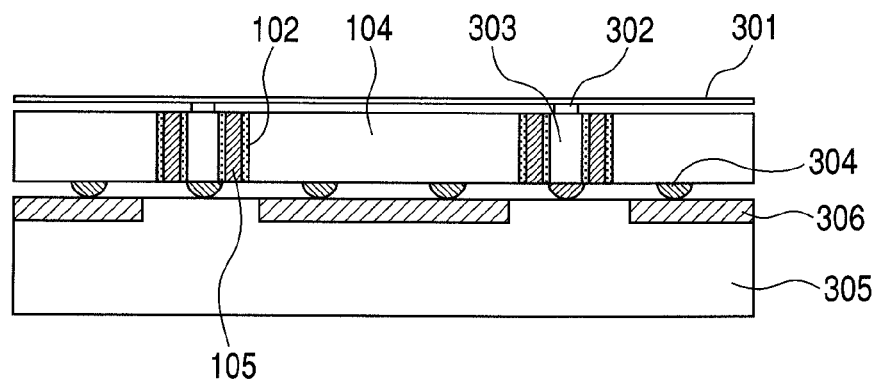

FIGS. 8CA and 8CB are drawings for describing an array type ultrasonic transducer of this fourth embodiment. FIG. 8CA is a perspective view of a part of the through-wiring substrate employed in an array type ultrasonic transducer. FIG. 8CB is a sectional view, taken along broken line 8CB-8CB, of a part of the ultrasonic transducer of this embodiment. In FIGS. 8CA and 8CB, the substrate 101 is placed upside down in comparison with the illustrations in FIGS. 8AA and 8AB and FIGS. 8BA and 8BB.

In this embodiment, grooves 105 only are formed in the portions of the substrate for forming the insulated region. The grooves do not penetrate through the substrate, so that the gap under membrane 301 is closed. Therefore, even if membrane 301 is formed previously with the gap, oxidation will not occur during the thermal oxidation. Therefore, in this embodiment, through-wirings 104 can be electrically isolated from each other without changing the gap between the upper electrode and the lower electrode without limitation of the positions of posts 302.

Fifth Embodiment

Fifth embodiment is described with reference to FIGS. 9A to 9C. This fifth embodiment is nearly the same as the second embodiment except the construction of through-wiring substrate 101 of the array type ultrasonic transducer.

Figure 9A:
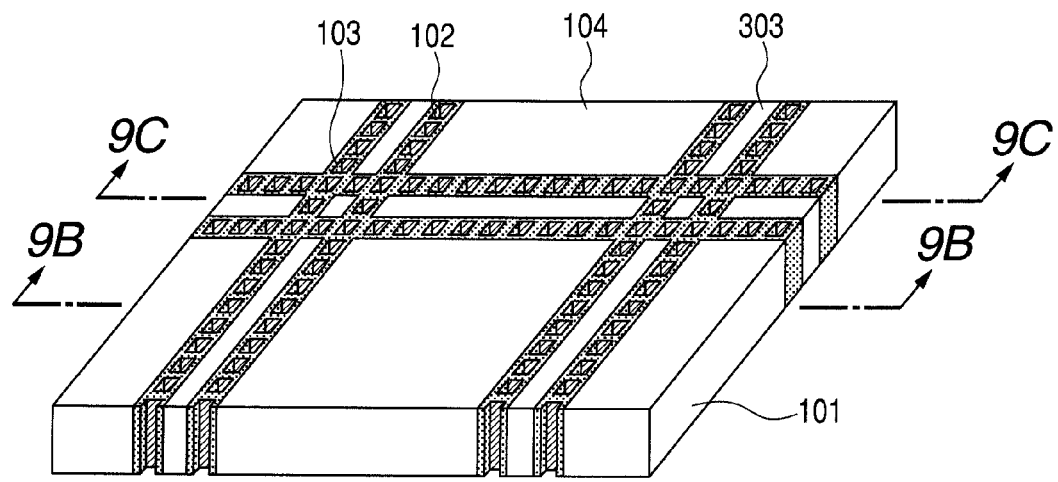
FIGS. 9A, 9B, and 9C are a perspective view and a sectional view of a structure having a through-wiring of a fifth embodiment.
Figure 9B:
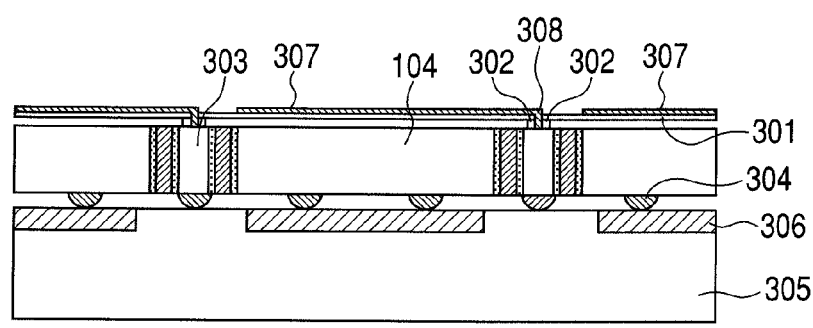
Figure 9C:
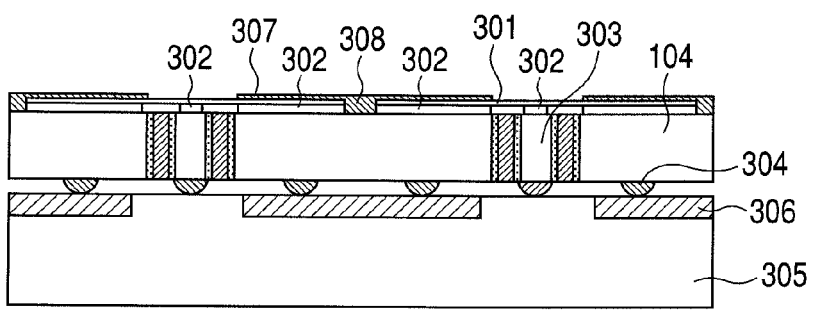

FIGS. 9A to 9C are drawings for describing an array type ultrasonic transducer. FIG. 9A is a perspective view of a part of the through-wiring substrate for an array type ultrasonic transducer. FIG. 9B is a sectional view, taken along broken line 9B-9B, of a part of the ultrasonic transducer of this embodiment. FIG. 9C is a sectional view, taken along broken line 9C-9C, of a part of the ultrasonic transducer of this embodiment.

In FIGS. 9A to 9C, the reference numerals denote the followings: 101, a substrate; 102, a thermally oxidized film; 103, a through-hole; 104, a through-wiring; 301, a membrane; 302, a post; 303, a frame; 304, a bump; 305, a circuit substrate; 306, an integrated circuit; 307, an electrode provided on membrane 301; 308, wiring for electrically connecting electrode 307 with portions of frame 303.

In this embodiment, frame 303 is divided into portions. The division of the frame enables application of different potentials to respective frame portions 303. In this embodiment, the membrane 301 is formed from an insulating material, and conductive electrodes 307 are formed in arbitrary forms on membrane 301. Electrodes 307 on membrane 301 are connected electrically to portions of frame 303 through-wiring 308 formed in post 302 and in detached portions of membrane 301. Thereby different voltages can be applied to respective portions of frame 303 to apply different potentials to connected portions of membrane 301.

According to this embodiment, different potentials can be applied to respective membrane of elements to obtain optimum driving and detection characteristics for the positions in the array to provide an array type ultrasonic transducer having a higher performance and higher functionality.

Sixth Embodiment

Sixth embodiment is described with reference to FIGS. 10A and 10B. This sixth embodiment is nearly the same as the second embodiment except the construction of the bump portion of through-wiring substrate 101 of the array type ultrasonic transducer.

Figure 10A:
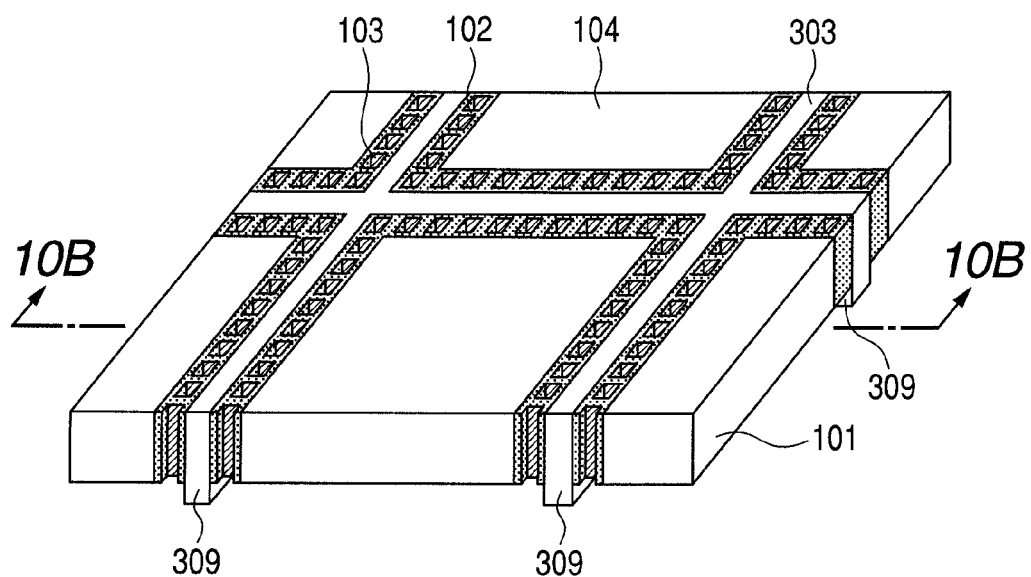
FIGS. 10A and 10B are a perspective view and a sectional view of a structure having a through-wiring of a sixth embodiment.
Figure 10B:
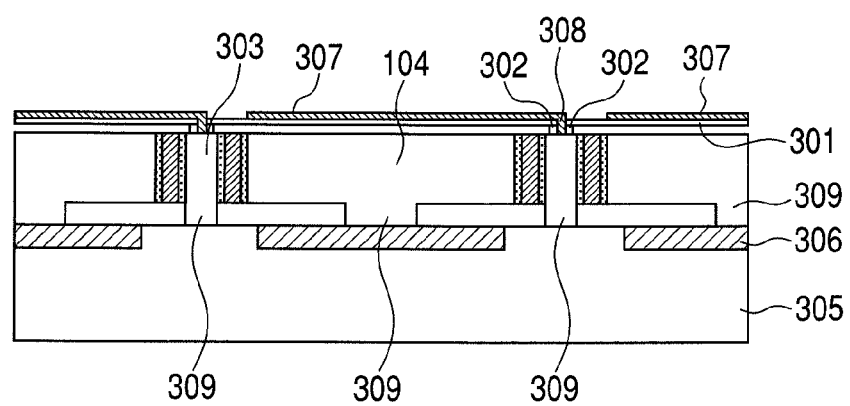

FIGS. 10A and 10B are drawings for describing an array type ultrasonic transducer of this sixth embodiment. FIG. 10A is a perspective view of a part of a through-wiring substrate employed in an array type ultrasonic transducer. FIG. 10B is a sectional view, taken along broken line 10B-10B, of a part of the array type ultrasonic transducer of this embodiment. In FIGS. 10A and 10B, the reference numerals denote the followings: 101, a substrate; 102, a thermally oxidized film; 103, a through-hole; 104, a through-wiring; 301, a membrane; 302, a post; 303, a frame; 305, a circuit substrate; 306, an integrated circuit; 309, a projection of frame 303 or of through-wiring 104.

In this embodiment, silicon projection 309 is provided in place of bump 304 employed in second embodiment, enabling direct junction of silicon instead of the bump junction.

Projections 309 are formed at lower portions of frame 303, and projections 309 are also formed at portions of the lower parts of through-wirings 104. This projections 309 can be formed by selective etching from one side of substrate 101 of through-wiring 104 having thermally oxidized film 102 having through-holes 103.

In the example illustrated in FIGS. 10A and 10B, in the etching, thermal oxidized film 102 is partly etched simultaneously. Otherwise, the thermal oxidation may be conducted by use of substrate 101 in which through-holes 103 have been formed and a part thereof has been dug selectively by etching. (The order of the formation of through-holes 103 and the digging may be reversed.) In this thermal oxidation, thermal oxidized film can grow on the portion other than the side face of through-holes 103. The thermal oxidized film should be removed at the portions in which the junction with substrate 305 is made, but in other portions, the thermal oxidized portion may be kept unremoved without causing a problem.

An array type ultrasonic transducer of high junction efficiency can be provided by direct junction of the substrate having projections 309 as illustrated in FIG. 10B with circuit substrate 305. Further the direct junction improves more the reliability of the transducer by preventing a trouble caused by bump junction, whereby an array type ultrasonic transducer can be provided with high reliability.

Seventh Embodiment

Seventh embodiment is described with reference to FIGS. 11A and 11B, and FIGS. 12AA to 12EB. This seventh embodiment is nearly the same as the second embodiment except the construction of the post portions on through-wiring substrate 101 of an array type ultrasonic transducer.

Figure 11A:
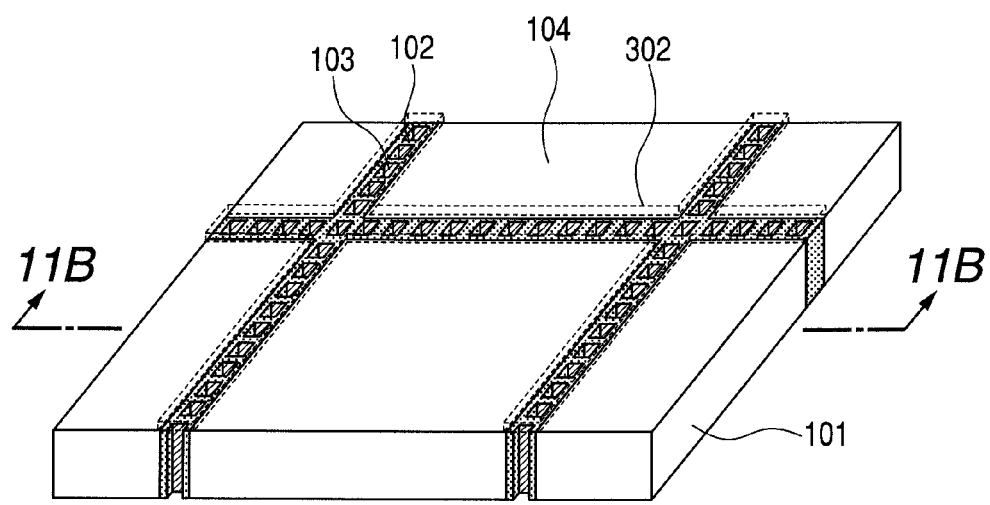
FIGS. 11A and 11B are a perspective view and a sectional view of a structure having a through-wiring of a seventh embodiment.
Figure 11B:
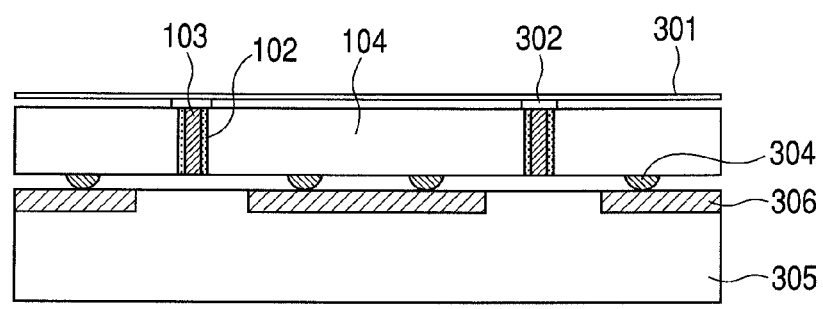

FIGS. 11A and 11B are drawings for describing an array type ultrasonic transducer of this seventh embodiment. FIG. 11A is a perspective view of a part of a through-wiring substrate employed in an array type ultrasonic transducer. FIG. 11B is a sectional view, taken along broken line 11B-11B, of a part of the array type ultrasonic transducer of this embodiment. In FIGS. 11A and 11B, the reference numerals denote the followings: 101, a substrate; 102, a thermally oxidized film; 103, a through-hole; 104, a through-wiring; 301, a membrane; 302, a post; 304, a bump; 305, a circuit substrate; 306, an integrated circuit.

In this embodiment, posts 302 are placed respectively on thermally oxidized film 102 having through-hole 103. In FIG. 11A, posts 302 are denoted by dotted lines. Such placement of posts 302 minimizes the ineffective space and enlarges the electrode area to improve the driving efficiency and detection sensitivity of membrane 301. Moreover, the distance between through-wirings 104 can be increased to decrease the parasitic capacitance between through-wirings 104 to decrease signal cross-talks in driving and detection to obtain better characteristics.

Figure 12A:
FIGS. 12AA and 12AB are sectional views for describing a process for producing a through-wiring in a seventh embodiment.
Figure 12A:
Figure 12B:
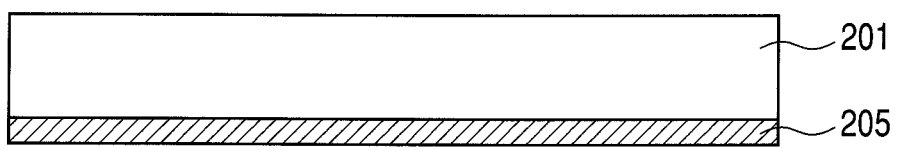
FIGS. 12BA and 12BB are sectional views for describing a process for producing a through-wiring in the seventh embodiment.
Figure 12B:
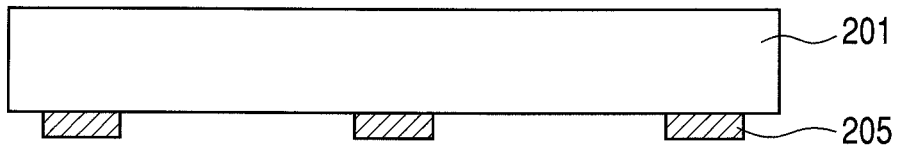
Figure 12C:
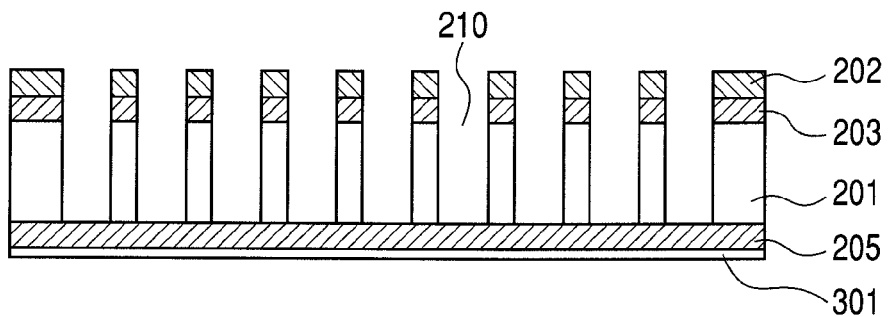
FIGS. 12CA and 12CB are sectional views for describing a process for producing a through-wiring in the seventh embodiment.
Figure 12C:
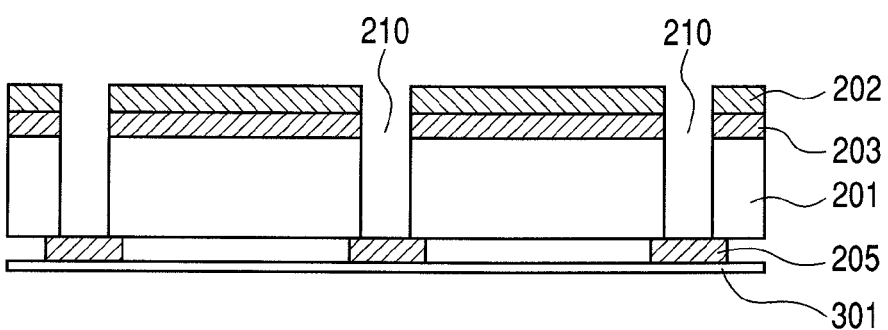

FIGS. 12AA to 12EB illustrate a process for producing an array type ultrasonic transducer of this seventh embodiment. Firstly, insulation film 205 is formed on silicon substrate 201 (lower side in the drawings, FIGS. 12AA and 12AB). This insulation film 205 is etched to leave portions thereof unetched along regions for formation of thermally oxidized film 102 (FIGS. 12BA and 12BB). The remaining regions of insulation film 205 functions as posts 302. Then membrane 301 is formed on posts 302 (remaining insulation film 205 as supporters), (FIGS. 12CA and 12CB). Membrane 301 may be formed by either a junction process or a surface process.

Then silicon substrate is etched anisotropically from the lower face thereof (upper side in the drawings) to form through-holes 210 (FIGS. 12CA and 12CB). In this etching, the etching conditions are selected to stop the etching to form through-holes 210 to reach just insulation film 205 on the upper face of substrate 201.

Figure 12D:
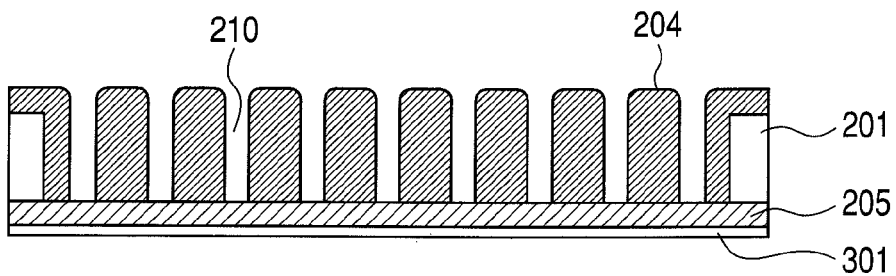
FIGS. 12DA and 12DB are sectional views for describing a process for producing a through-wiring in the seventh embodiment.
Figure 12D:
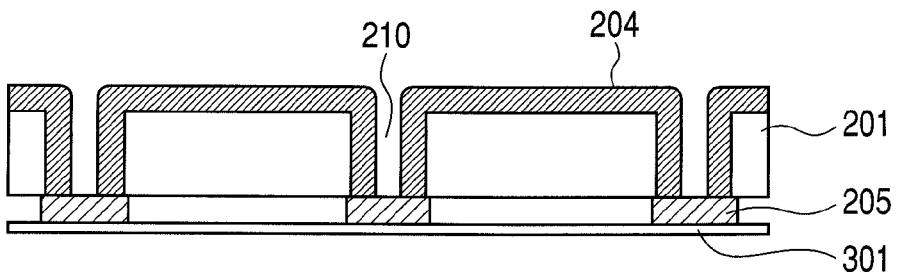
Figure 12E:
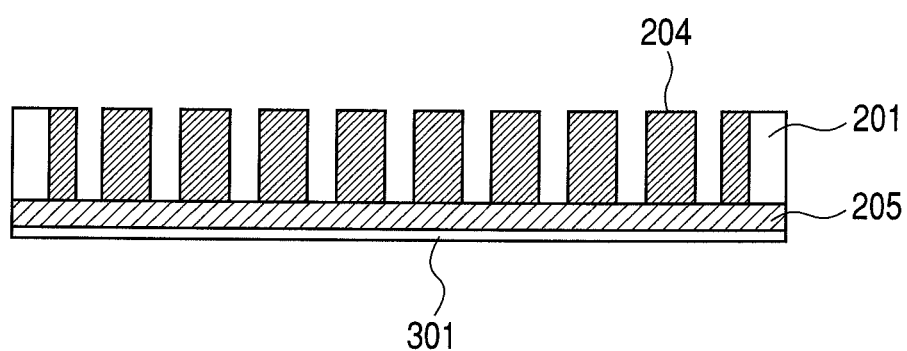
FIGS. 12EA and 12EB are sectional views for describing a process for producing a through-wiring in the seventh embodiment.
Figure 12E:
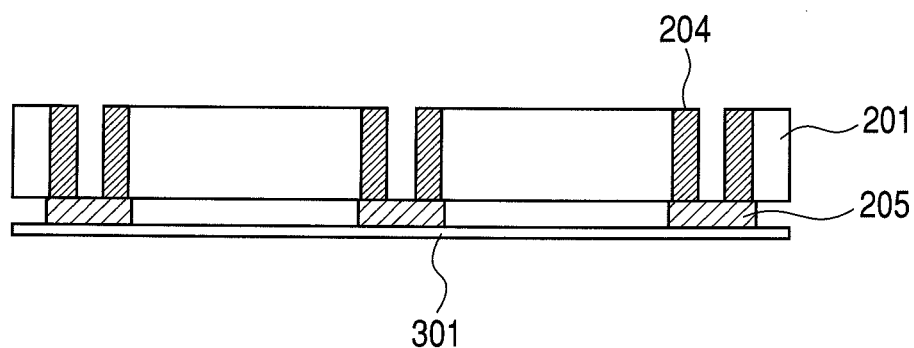

Then the side faces of through-holes 210 are thermally oxidized (FIGS. 12DA and 12DB). For the thermal oxidation, the upper face of membrane 301 should be formed from an oxidation-resistant material or be coated with an oxidation-resistant material. On the lower face of substrate 201 (upper side in the drawings), thermally oxidized film 204 comes to be formed. This film can be etched on taking a contact with bumps. When the formation of the thermally oxidized film on the substrate causes a trouble, the back face of the substrate is preferably masked with a oxidation-resistant material to cause thermal oxidation only on the side face of through-holes 210 (FIGS. 12EA and 12EB). Finally, bumps 304 are formed for bump junction. Through the above production process, even when membrane 301 with a gap is preliminarily formed, through-wirings 104 can be formed without causing oxidation in the gap on the thermal oxidation.

In this embodiment, membrane 301 with a gap is formed before the formation of the through-holes and thermal oxidation of the side face of the through-holes, but is not limited thereto. Membrane 301 may be formed after the steps of formation of posts 302, formation of the through-holes and thermal oxidation of the side faces of the through-holes. Or in place of insulation film 205 on a substrate, SOI substrate may be employed.

Eighth Embodiment

Eighth embodiment is described with reference to FIGS. 13A and 13B. This eighth embodiment is nearly the same as the second embodiment except the construction of through-wiring substrate 101 of an array type ultrasonic transducer.

Figure 13A:
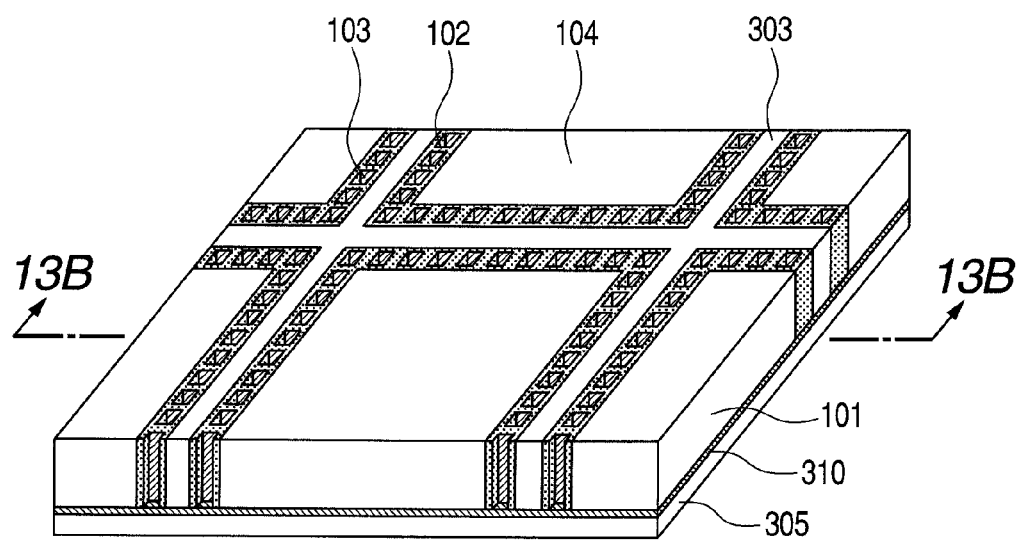
FIGS. 13A and 13B are a perspective view and a sectional view of a structure having a through-wiring of an eighth embodiment.
Figure 13B:
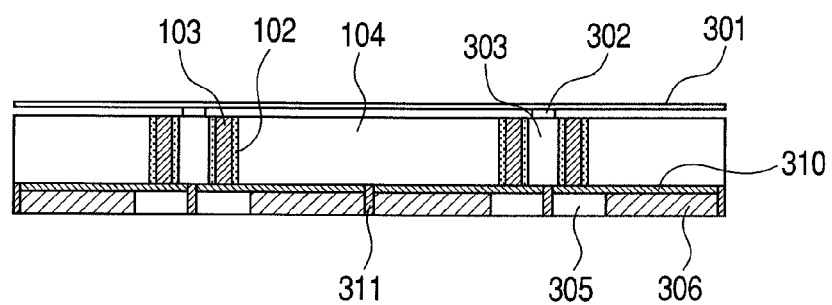

FIGS. 13A and 13B are drawings for describing an array type ultrasonic transducer of this eighth embodiment. FIG. 13A is a perspective view of a part of a through-wiring substrate employed in an array type ultrasonic transducer. FIG. 13B is a sectional view, taken along broken line 13B-13B, of a part of the array type ultrasonic transducer of this embodiment. In FIGS. 13A and 13B, the reference numerals denote the followings: 101, a substrate; 102, a thermally oxidized film; 103, a through-hole; 104, a through-wiring; 301, a membrane; 302, a post; 306, an integrated circuit.

This embodiment is different from the above embodiments in that the integrated circuit 306 is mounted on through-wiring substrate 101. An SOI substrate is employed as substrate 101. Through-wirings 104 are formed on the thick handle layer side, and the integrated circuits 306 are formed on the side of thin active layer 305. The constitution of the side of through-wiring 104 is same as that of the second embodiment. On the other hand, on the side of integrated circuit 306, a part of active layer 305 and a part of BOX layer 310 (an insulation layer between the active layer of the SOI substrate and the handle layer) are bored to connect the substrate of the handle layer with circuit 306 by wiring 311. With this constitution, through-wiring 104 is connected with integrated circuit 306, and frame 303 (membrane 301) is connected with integrated circuit 306 electrically. Thereby a potential can be applied from integrated circuit 306 to membrane 301, and driving signals and detection signals can be emitted and received through the lower face of through-wiring 104.

In this embodiment, the cause of decrease of the reliability of the bump junction can be eliminated to provide an array type ultrasonic transducer with high reliability. Furthermore, integrated circuit 306 can be combined into one body to improve mass-productivity and to improve the functionality and performance.

Ninth Embodiment

Ninth embodiment is described with reference to FIGS. 14A and 14B. This ninth embodiment is an array type acceleration sensor employing the structure of the first embodiment.

Figure 14A:
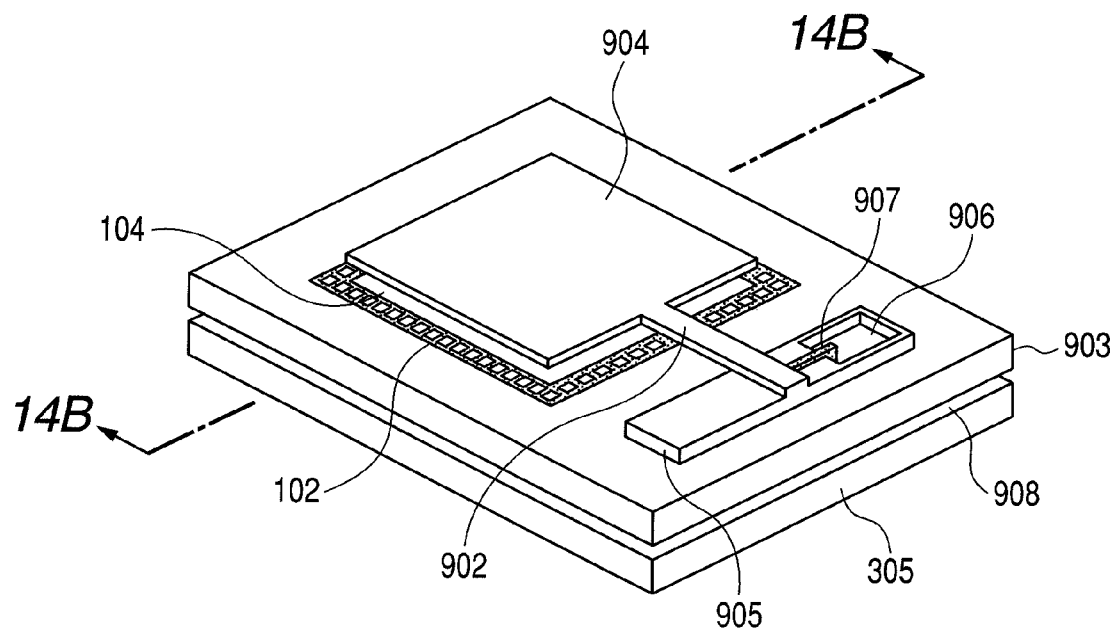
FIGS. 14A and 14B are a perspective view and a sectional view of a structure having a through-wiring of a ninth embodiment.

FIG. 14A is a perspective view of an acceleration sensor of this embodiment. FIG. 14B is a sectional view taken along broken line 14B-14B. In FIGS. 14A and 14B, the reference numerals denote the followings: 902, a supporting beam for supporting movably a movable piece 904; 903, a substrate member counterposed against movable piece 904; 905, a holder formed from an insulating material for holding the supporting beam 902; 104, a through-wiring opposing movable piece 904 with an interval and functioning also as a detection electrode; 906 a hole bored through holder 905 and substrate member 903; 907, a wiring for transmitting a potential of supporting beam 902 to the side of circuit substrate 305; 908, a space between substrate member 903 and circuit substrate 305. Substrate member 903 serves also as electrode-forming substrate on which detection electrode 104 is formed.

Movable piece 904 is supported by supporting beam 902 to be capable of vibration. Supporting beam 902 is connected to supporter 905 fixed to substrate member 903. In a non-action state, movable piece 904 is held at a prescribed distance from detection electrode 104. Movable piece 904 can be displaced or vibrated upward and downward in FIG. 14B by deformation of supporting beam 902 under an action onto movable piece 904.

Figure 14B:
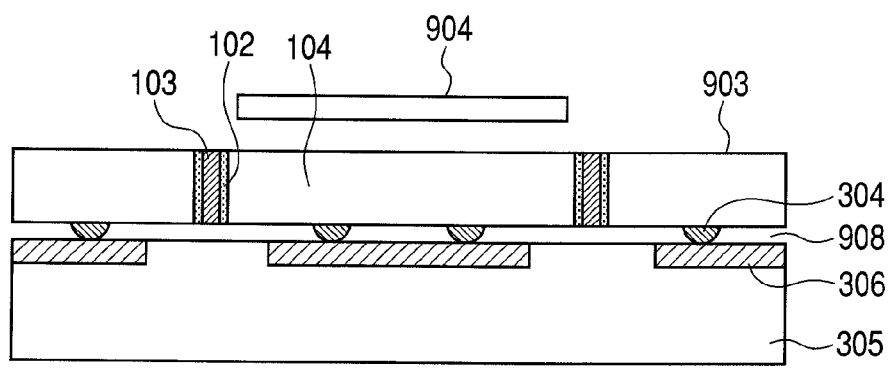

When an acceleration force is applied vertically to substrate member 903 of the sensor, movable piece 904 is displaced upward or downward in FIG. 14B. Thereby the interval between movable piece 904 and detection electrode 104 is changed from that at the acceleration-free state. The acceleration can be detected by detecting a change of the interval. That is, the acceleration is detected by detecting the relative position of movable piece 904 from detection electrode 104 counterposed at an interval against movable piece 904.

The change of the interval between movable piece 904 and substrate member 903 or detection electrode 104 is detected by a change of the capacitance formed therebetween. In this embodiment, detection electrode 104 is placed in substrate member 903, and the change of the capacitance formed between detection electrode 104 and movable piece 904 is detected. The thickness of detection electrode 104 is equal to the thickness of substrate member 903. Bumps 304 are formed on the face of electrode formation substrate 903 at the side opposite to the movable piece 904. Thus, the detection signal is taken out from detection electrode 104 by utilizing the wiring through the bump 304.

With movable piece 904 kept at a certain potential by a wiring through the bump 304, a decrease of the interval between movable piece 904 and detection electrode 104 increases the electrostatic capacitance and strengthens the detection signal correspondingly, whereas an increase of the interval between movable piece 904 and detection electrode 104 decreases the electrostatic capacitance and weakens the detection signal correspondingly. In such a manner, corresponding to the strength and direction of the acceleration, a force is applied to movable piece 904, changing the interval between movable piece 904 and detection electrode 104 to emit a signal reflecting the interval change. Therefore, the strength and direction of the acceleration can be detected by circuit 306 based on the detection signal.

In the sensor of this embodiment, the back face of substrate member 903 can be connected with circuit substrate 305 by simple wiring construction, whereby the detection signal can be detected regardless of the shape and size of movable piece 904 and the relative positions to other parts. Therefore the movable piece 904 can be made larger relative to the area of the substrate. A larger size (i.e., a larger mass) of movable piece 904 will be displaced larger by the same acceleration force, which enables increase of the sensor sensitivity. Further, a larger confronting area of movable piece 904 with detection electrode 104 will give a larger electrostatic capacitance for the detection, which contributes also the increase of the sensor sensitivity.

In this embodiment, since the wiring for the detection signal is placed outside the portion facing the movable piece 904, the detection by signal will not be deteriorated by interaction of movable piece 904 with the signal detection wiring to enable the detection with less error and higher precision.

Further, since the constitution on the side of movable piece 904 is simple, the settlement on the side of movable pert 904 can be made precisely including the interval between movable piece 904 and detection electrode 104. This also contributes the less error and higher precision of the detection.

In particular, in two-dimensional arrangement of plural movable pieces 904 at intervals on substrate member 903, the movable piece 904 can be made larger in size, and a wiring error component is made less liable to overlap with the detection signal. Further, the wiring is made on the back face side to make it easier to make larger the distance between the wirings in comparison with the wiring on the front face side to prevent cross talk between the wirings. Thus, a sensor can be provided which is capable of detecting information from two-dimensionally arranged detection parts with high sensitivity and high precision. The sensor of this embodiment can be produced in a similar manner as those mentioned in the above embodiments.

In this specification, descriptions are made on array type ultrasonic transducers and an array type acceleration sensor, but the invention is not limited thereto. The structure of the present invention is applicable, regardless of an array type or a single element, to those for detecting a physical quantity by utilizing an electrostatic attraction force or a change of an electrostatic capacitance, including ultrasonic transducers, pressure sensors, acceleration sensors, and gyro sensors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-144166, filed Jun. 2, 2008, which is hereby incorporated by reference herein in its entirety.

The invention claimed is:

1. A structure having a substrate including a plurality of conductive regions insulated electrically from each other, comprising
a movable piece supported movably above a first face of the conductive region,
the movable piece having an electrode in opposition to the conductive region,
the structure being constructed to be capable of emitting and receiving electric signals through a second face opposite from the first face of the conductive region,
the plural conductive regions being insulated by oxidized regions that are formed from a thermal oxide of a material of the substrate and that are placed so as to surround each of through-holes formed in the substrate,
wherein of through-holes between the conductive regions, in a region between through-holes adjacent to each other, thermal oxides formed so as to surround each of a periphery of the through-holes adjacent to each other are connected from a side of the first face of the substrate to a side of the second face.

2. The structure according to claim 1, wherein pairs of the conductive region and the movable piece are provided in plurality.

3. An ultrasonic transducer comprising the structure set forth in claim 1, wherein the movable piece is a membrane, and a closed gap is formed between the conductive region and the membrane.

4. A physical sensor comprising the structure set forth in claim 1, being capable of taking out, from the second face of the conductive region, an electric signal of a change in the electrostatic capacitance between the conductive region and the electrode.

5. A process for producing a structure having a substrate including a plurality of conductive regions, functioning as electric wirings in a thickness direction and being insulated electrically from each other, comprising steps of:
forming through-holes at intervals through a base material of the substrate, and
oxidizing thermally the base material at least at an inside face of the through-holes to form oxidized regions to form plural conductive regions insulated electrically from each other, wherein the through-holes are formed such that each conductive region is individually surrounded by a plurality of through-holes, wherein of through-holes between the conductive regions, in a region between through-holes adjacent to each other, thermal oxides formed so as to surround each of a periphery of the through-holes adjacent to each other are connected from a side of a first face of the base material to a second side of a second face opposite from the first face of the base material.

6. The process for producing the structure according to claim 5, wherein the process comprising further a step of providing a movable piece supported movably on a first side of at least one of the conductive regions.

7. A process for producing a structure having a substrate including a plurality of conductive regions, functioning as electric wirings in a thickness direction and being insulated electrically from each other, comprising steps of:

forming grooves at intervals through a base material of the substrate, and oxidizing thermally the base material at least at an inside face of the grooves to form oxidized regions to form plural conductive regions insulated electrically from each other, wherein the grooves are formed such that each conductive region is individually surrounded by a plurality of grooves, wherein of grooves between the conductive regions, in a region between grooves adjacent to each other, thermal oxides formed so as to surround each of a periphery of the grooves adjacent to each other are connected from a side of a first face of the base material to a second side of a second face opposite from the first face of the base material.

8. The process for producing the structure according to claim 7, wherein the process further comprising a step of providing a movable piece supported movably on a first side of at least one of the conductive regions.

9. A structure having a substrate including a plurality of conductive regions insulated electrically from each other, comprising a movable piece supported movably above a first face of the conductive region, the movable piece having an electrode in opposition to the conductive region, the structure being constructed to be capable of emitting and receiving electric signals through a second face opposite from the first face of the conductive region, the plurality of conductive regions being insulated by oxidized regions that are formed from a thermal oxide of a material of the substrate and that are placed so as to surround each of grooves formed in the substrate, wherein of grooves between the conductive regions, in a region between grooves adjacent to each other, thermal oxides formed so as to surround each of a periphery of the grooves adjacent to each other are connected from a side of the first face of the substrate to a side of the second face.

10. The structure according to claim 9, wherein pairs of the conductive region and the movable piece are provided in plurality.

11. An ultrasonic transducer comprising the structure set forth in claim 9, wherein the movable piece is a membrane, and a closed gap is formed between the conductive region and the membrane.

12. A physical sensor comprising the structure set forth in claim 9, being capable of taking out, from the second face of the conductive region, an electric signal of a change in the electrostatic capacitance between the conductive region and the electrode.

* * * * *